US012666713B2

(12) United States Patent
Mandalapu et al.

(10) Patent No.: US 12,666,713 B2
(45) Date of Patent: Jun. 23, 2026

(54) DOUBLE SIDE TRANSISTORS ON SAME SILICON WAFER

(71) Applicant: Advanced Micro Devices, Inc., Santa Clara, CA (US)

(72) Inventors: Chandra Sekhar Mandalapu, Santa Clara, CA (US); Rahul Agarwal, Livermore, CA (US); Rajasekaran Swaminathan, Austin, TX (US); Richard T. Schultz, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 846 days.

(21) Appl. No.: 17/873,591

(22) Filed: Jul. 26, 2022

(65) Prior Publication Data

US 2024/0038596 A1 Feb. 1, 2024

(51) Int. Cl.
*H10D 86/01* (2026.01)
*H10D 86/00* (2025.01)
(Continued)

(52) U.S. Cl.
CPC ........... *H10D 86/01* (2025.01); *H10D 86/201* (2025.01); *H10P 14/69215* (2026.01); *H10W 70/635* (2026.01); *H10W 70/698* (2026.01)

(58) Field of Classification Search
CPC ...... H10D 86/01; H10D 86/201; H10D 84/85; H10D 88/00; H10D 88/101;
(Continued)

(56) References Cited

U.S. PATENT DOCUMENTS 4,851,892 A 7/1989 Anderson et al.
5,591,999 A 1/1997 Momodomi et al.
(Continued)

OTHER PUBLICATIONS

Xie et al., "5nm FinFET Standard Cell Library Optimization and Circuit Synthesis in Near- and Super-Threshold Voltage Regimes", 2014 IEEE Computer Society Annual Symposium on VLSI, Jul. 2014, pp. 424-429.
(Continued)

*Primary Examiner* — Robert G Bachner
(74) *Attorney, Agent, or Firm* — Kowert, Hood, Munyon, Rankin & Goetzel, P.C.; Rory D. Rankin

(57) ABSTRACT

An apparatus and method for efficiently increasing semiconductor chip functionality in a particular area. A semiconductor fabrication process (or process) grows a silicon substrate layer, and forms multiple p-type and n-type transistors along a front side surface of the silicon substrate layer. The process flips the silicon substrate layer and removes silicon substrate leaving a particular thickness of the silicon substrate layer. The process forms multiple p-type and n-type transistors along the back side surface of the silicon substrate layer, and forms metal layers that connect terminals of the transistors formed along the back side surface to particular signals. The process forms through silicon vias (TSVs) that traverse through the silicon substrate layer. The process again flips the silicon substrate layer, and forms metal layers that connect terminals of the transistors formed along the front side surface to particular signals.

13 Claims, 10 Drawing Sheets

Integrated Circuit Fabrication
100

ILD Oxide 102    Silicon Substrate 104    106    108    110

(51) Int. Cl.
H10P 14/692 (2026.01)
H10W 70/63 (2026.01)
H10W 70/698 (2026.01)

(58) Field of Classification Search
CPC ............. H01L 21/02164; H01L 23/147; H01L
23/49827; H01L 21/2007; H01L 23/481
See application file for complete search history.

(56) References Cited

U.S. PATENT DOCUMENTS

| | | | |
|---|---|---|---|
| 6,100,101 A | 8/2000 | Marathe et al. | |
| 6,242,767 B1 | 6/2001 | How et al. | |
| 6,609,242 B1 | 8/2003 | Slade | |
| 7,064,074 B2 | 6/2006 | van Bentum et al. | |
| 7,737,482 B2 | 6/2010 | Cheng et al. | |
| 8,185,855 B2 | 5/2012 | Kanari | |
| 8,264,007 B2 | 9/2012 | Becker et al. | |
| 8,356,268 B2 | 1/2013 | Becker et al. | |
| 8,513,978 B2 | 8/2013 | Sherlekar | |
| 8,561,003 B2 | 10/2013 | Kawa et al. | |
| 8,680,626 B2 | 3/2014 | Smayling et al. | |
| 9,400,862 B2 | 7/2016 | Kawa et al. | |
| 9,431,383 B2 | 8/2016 | Baek et al. | |
| 9,460,259 B2 | 10/2016 | Baek et al. | |
| 9,502,351 B1 | 11/2016 | Sahu | |
| 9,553,028 B2 | 1/2017 | Kie et al. | |
| 9,589,847 B1 | 3/2017 | Chi et al. | |
| 9,633,987 B2 | 4/2017 | Smayling et al. | |
| 9,659,939 B1 | 5/2017 | Cao et al. | |
| 9,691,768 B2 | 6/2017 | Moroz et al. | |
| 9,704,995 B1 | 7/2017 | Schultz | |
| 9,837,398 B1 | 12/2017 | Rowhani et al. | |
| 9,837,437 B2 | 12/2017 | Baek et al. | |
| 9,881,926 B1 | 1/2018 | Basker et al. | |
| 11,211,330 B2 | 12/2021 | Schultz | |
| 2001/0015464 A1 | 8/2001 | Tamaki | |
| 2002/0069396 A1 | 6/2002 | Bhattacharya et al. | |
| 2003/0023937 A1 | 1/2003 | McManus et al. | |
| 2005/0045916 A1 | 3/2005 | Kim | |
| 2007/0063244 A1 | 3/2007 | Ho et al. | |
| 2007/0187719 A1* | 8/2007 | Yuan ..................... | H10D 86/60 |
| | | | 257/E21.415 |
| 2007/0284619 A1 | 12/2007 | Kanno et al. | |
| 2008/0283925 A1 | 11/2008 | Berthold et al. | |
| 2010/0095263 A1 | 4/2010 | Frederick | |
| 2010/0127333 A1 | 5/2010 | Hou et al. | |
| 2010/0287518 A1 | 11/2010 | Becker | |
| 2012/0313148 A1 | 12/2012 | Schultz | |
| 2013/0026572 A1 | 1/2013 | Kawa et al. | |
| 2013/0119474 A1 | 5/2013 | Schultz | |
| 2013/0146986 A1 | 6/2013 | Rashed et al. | |
| 2013/0154128 A1 | 6/2013 | Wang et al. | |
| 2013/0295756 A1 | 11/2013 | Yuan et al. | |
| 2013/0313513 A1 | 11/2013 | Cappellani et al. | |
| 2013/0334613 A1 | 12/2013 | Moroz | |
| 2014/0197494 A1 | 7/2014 | Schultz | |
| 2014/0252650 A1 | 9/2014 | Utsumi | |
| 2015/0048425 A1 | 2/2015 | Park et al. | |
| 2015/0052494 A1 | 2/2015 | Tarabbia et al. | |
| 2015/0069531 A1 | 3/2015 | Naczas et al. | |
| 2015/0214113 A1 | 7/2015 | Bouche et al. | |
| 2015/0269302 A1 | 9/2015 | Katta et al. | |
| 2015/0270176 A1 | 9/2015 | Xie et al. | |
| 2015/0302917 A1 | 10/2015 | Grover et al. | |
| 2015/0333008 A1 | 11/2015 | Gupta et al. | |
| 2016/0163644 A1 | 6/2016 | Woo et al. | |
| 2016/0284705 A1 | 9/2016 | Chung | |
| 2017/0125292 A1 | 5/2017 | Greene et al. | |
| 2017/0263506 A1 | 9/2017 | Bouche et al. | |
| 2017/0294448 A1 | 10/2017 | Debacker et al. | |
| 2017/0323902 A1 | 11/2017 | Zeng et al. | |
| 2017/0365621 A1 | 12/2017 | Becker et al. | |
| 2017/0371995 A1 | 12/2017 | Correale, Jr. et al. | |
| 2017/0373090 A1 | 12/2017 | Correale, Jr. et al. | |
| 2018/0033701 A1 | 2/2018 | Bouche et al. | |
| 2018/0090440 A1 | 3/2018 | Schultz et al. | |
| 2018/0218981 A1 | 8/2018 | Lin et al. | |
| 2018/0308796 A1 | 10/2018 | Peng et al. | |
| 2018/0314785 A1 | 11/2018 | Schultz | |
| 2019/0355829 A1 | 11/2019 | Wang et al. | |

OTHER PUBLICATIONS

Cui et al., "7nm FinFET Standard Cell Layout Characterization and Power Density Prediction in Near- and Super-Threshold Voltage Regimes", International Green Computing Conference, Nov. 2014, 7 pages.

International Search Report and Written Opinion in International Application No. PCT/US2018/029767, mailed Jul. 11, 2018, 14 pages.

International Search Report and Written Opinion in International Application No. PCT/US2018/029760, mailed Jul. 16, 2018, 16 pages.

Non-Final Office Action in U.S. Appl. No. 15/636,278, mailed Apr. 5, 2019, 12 pages.

Final Office Action in U.S. Appl. No. 15/636,278, mailed Nov. 18, 2019, 16 pages.

Non-Final Office Action in U.S. Appl. No. 15/636,278, mailed May 14, 2020, 15 pages.

Wachnik et al., "Practical Benefits of the Electromigration Short-Length Effect, Including a New Design Rule Methodology and an Electromigration Resistant Power Grid with Enhanced Wireability", 2000 Symposium on VLSI Technology Digest of Technical Papers, Jun. 13-15, 2000, pp. 220-221.

Final Office Action in U.S. Appl. No. 15/636,278, mailed Dec. 23, 2020, 26 pages.

Non-Final Office Action in U.S. Appl. No. 15/636,278, mailed Jun. 10, 2021, 29 pages.

Communication pursuant to Article 94(3) EPC in European Application No. 18724699.6, mailed Jul. 7, 2021, 9 pages.

Communication pursuant to Article 94(3) EPC in European Application No. 18724101.3, mailed Jul. 26, 2021, 9 pages.

* cited by examiner

Integrated Circuit Fabrication
100
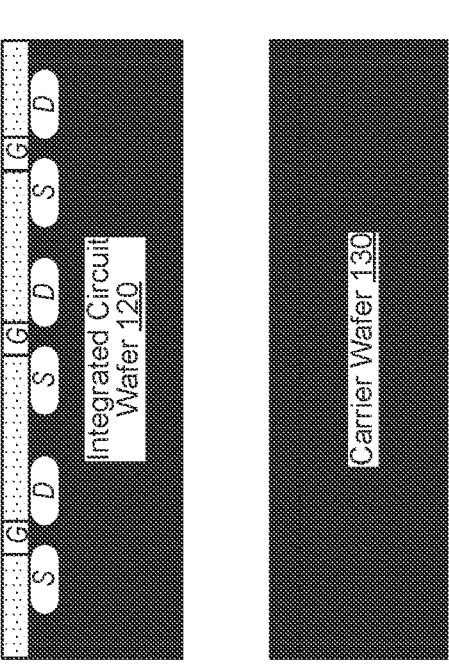
Integrated Circuit Wafer 120
Carrier Wafer 130
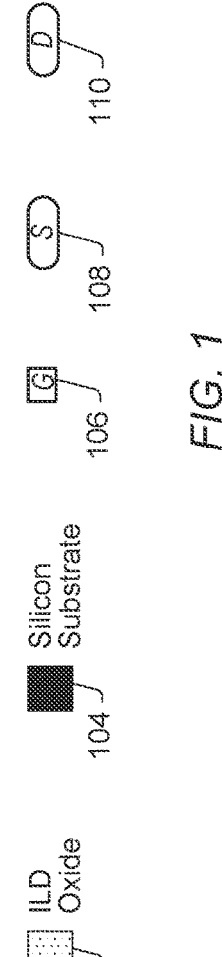
ILD Oxide
102
Silicon Substrate
104
G 106
S 108
D 110
FIG. 1

*Integrated Circuit Fabrication*
*200*
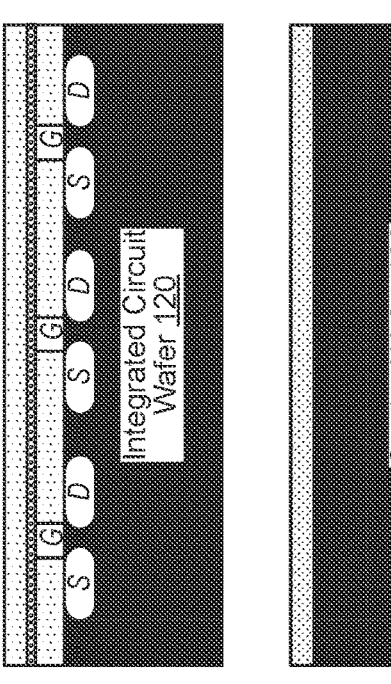
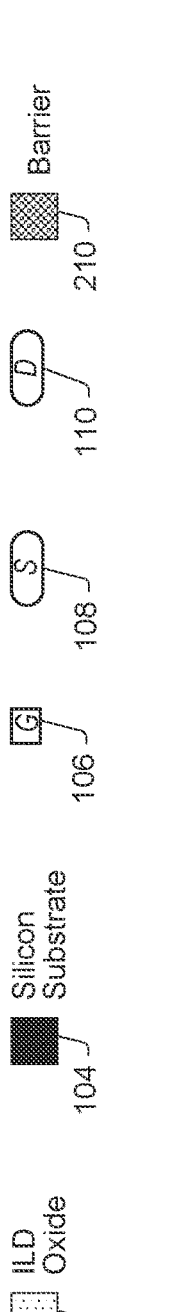
*FIG. 2*

Integrated Circuit Fabrication
300
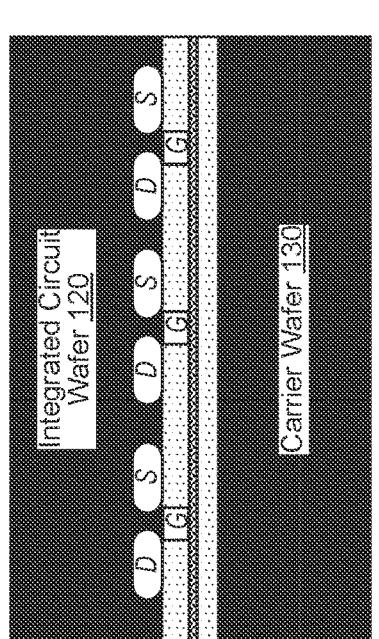
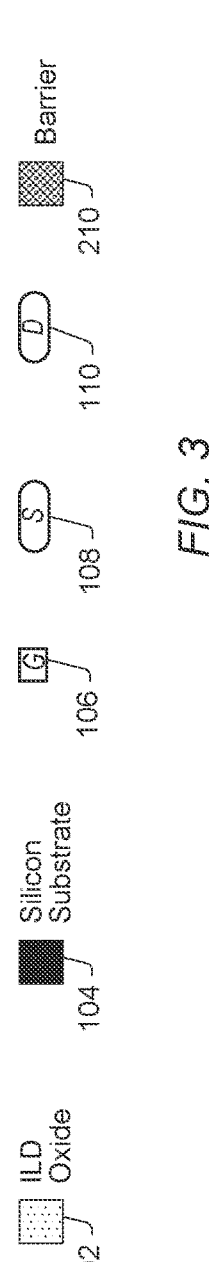
*FIG. 3*

Integrated Circuit Fabrication
400

Integrated Circuit Wafer
120

Carrier Wafer 130

ILD Oxide
102

Silicon Substrate
104

G
106

S
108

D
110

Barrier
210

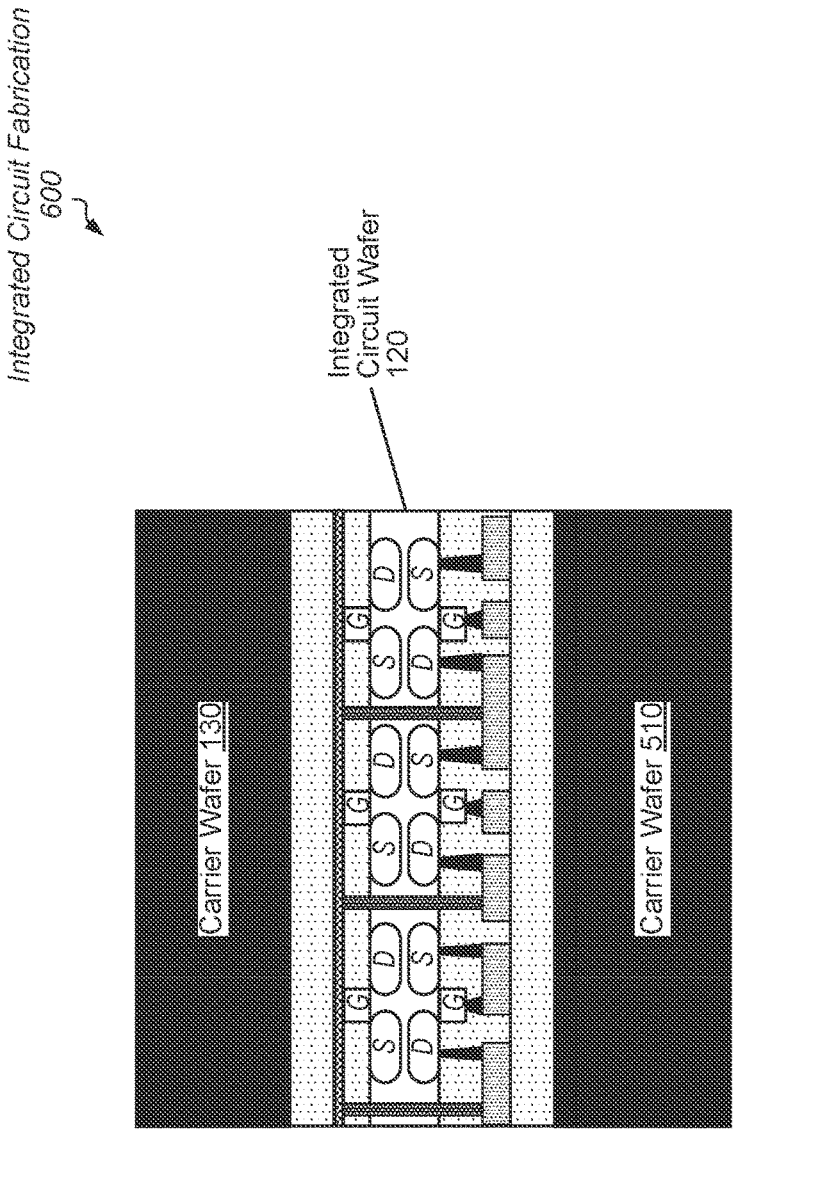
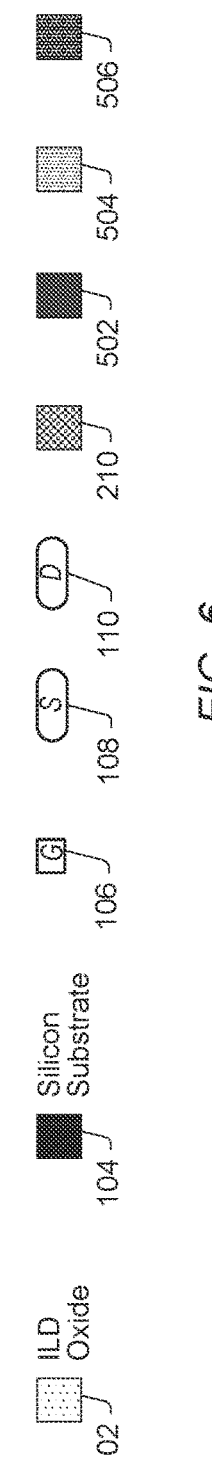
FIG. 6

*Integrated Circuit Fabrication*
*700*

Integrated
Circuit Wafer
120

Carrier Wafer 510

ILD
Oxide
102

Silicon
Substrate
104

G
106

S
108

D
110

210

502

504

506

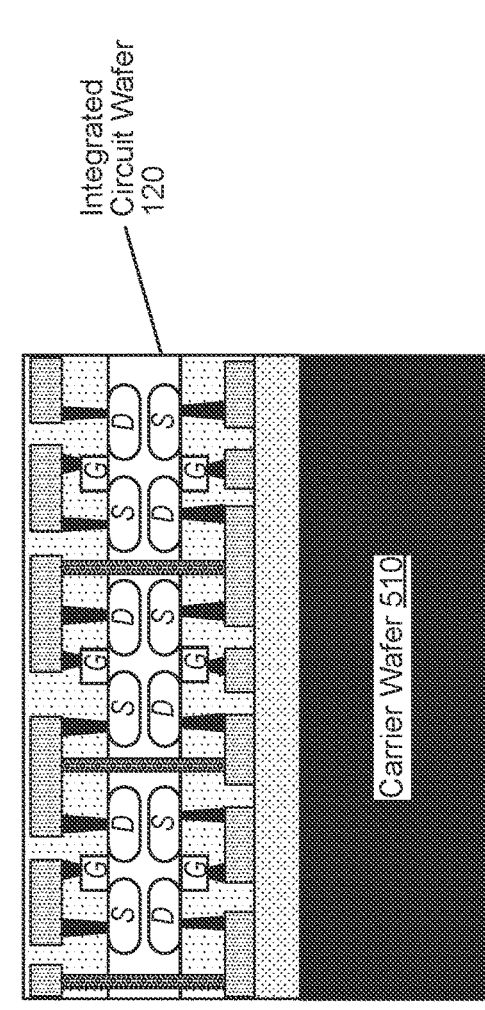
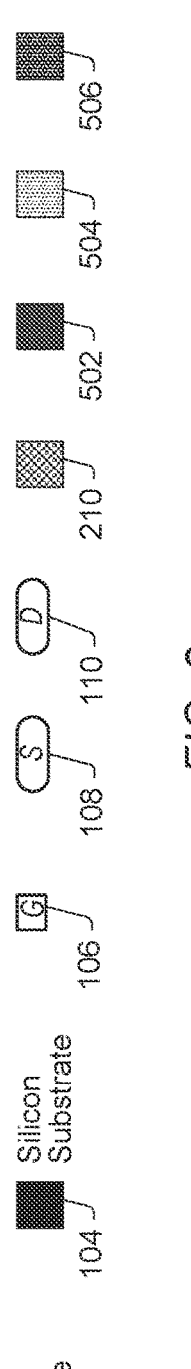
*Integrated Circuit Fabrication*
*800*
Integrated
Circuit Wafer
120
Carrier Wafer 510
ILD
Oxide
102
Silicon
Substrate
104
G
106
S
108
D
110
210
502
504
506
*FIG. 8*

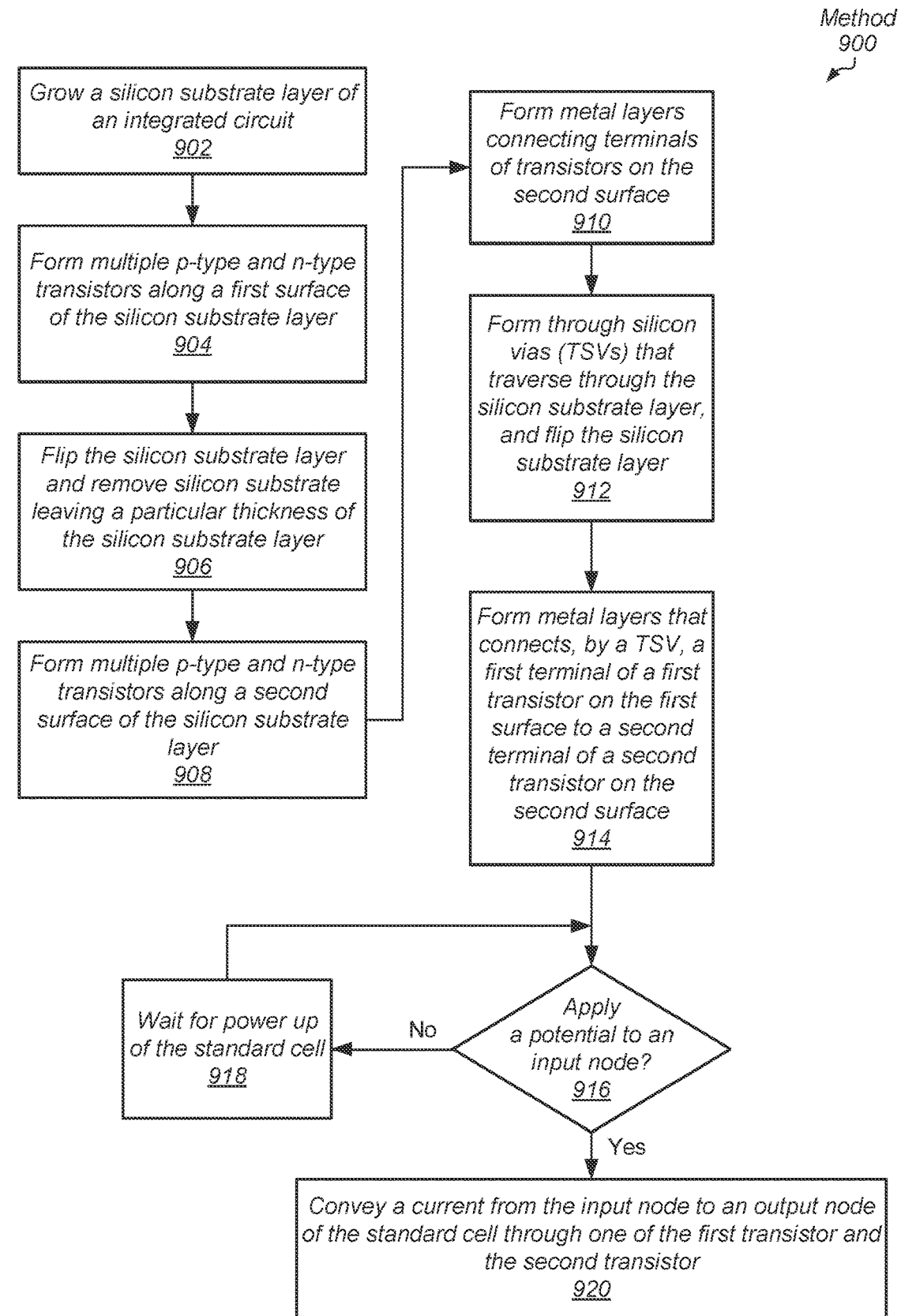

*Method*
*900*

Grow a silicon substrate layer of an integrated circuit
902

Form multiple p-type and n-type transistors along a first surface of the silicon substrate layer
904

Flip the silicon substrate layer and remove silicon substrate leaving a particular thickness of the silicon substrate layer
906

Form multiple p-type and n-type transistors along a second surface of the silicon substrate layer
908

Form metal layers connecting terminals of transistors on the second surface
910

Form through silicon vias (TSVs) that traverse through the silicon substrate layer, and flip the silicon substrate layer
912

Form metal layers that connects, by a TSV, a first terminal of a first transistor on the first surface to a second terminal of a second transistor on the second surface
914

Apply a potential to an input node?
916

No

Wait for power up of the standard cell
918

Yes

Convey a current from the input node to an output node of the standard cell through one of the first transistor and the second transistor
920

*FIG. 9*

*Computing System*
*1000*

DOUBLE SIDE TRANSISTORS ON SAME SILICON WAFER

BACKGROUND

Description of the Relevant Art

As both semiconductor manufacturing processes advance and on-die geometric dimensions reduce, semiconductor chips provide more functionality and performance. While many advances have been made, design issues still arise with modern techniques in processing and integrated circuit design that limit potential benefits. For example, capacitive coupling, electromigration, and leakage currents are some issues which affect the placement of devices and the routing of signals across an entire die of a semiconductor chip. In addition, as the functionality increases, a floorplan of a semiconductor die (or die) is limited unless the semiconductor package size increases.

The floorplan of the die is a graphical representation of the partitioning of the die. The partitioning uses shapes, such as rectangles, to represent the placement of multiple components such as one or more processing units, one or more blocks of memory, one or more interface units, and so forth. The shapes used for the floorplan have dimensions of the components they represent. The dimensions of the shapes have limits in order to place all of the components on the same die. The limits are set by various factors such as placement of standard cells from a standard library, area used by wide signal bus routes, an area for bonding pads, reserved areas are areas for routing and buffering clock signals, reserved areas for the combination of through silicon vias (TSVs) and their corresponding keep out zones, and so forth.

If the area for components of the die is not present in the floorplan, then the components do not fit on the same die. Accordingly, significant redesign is required along with possible moving or shifting of macro blocks in the floorplan. Such redesign consumes an appreciable amount of design time, which delays product releases.

In view of the above, efficient methods and systems for increasing semiconductor chip functionality in a particular area are desired.

BRIEF DESCRIPTION OF THE DRAWINGS

FIG. 1 is a generalized diagram of a cross-sectional view of a portion of an integrated circuit during integrated circuit fabrication with a silicon substrate layer of a single silicon wafer with transistors formed on two surfaces.

FIG. 2 is a generalized diagram of a cross-sectional view of a portion of an integrated circuit during integrated circuit fabrication with a silicon substrate layer of a single silicon wafer with transistors formed on two surfaces.

FIG. 3 is a generalized diagram of a cross-sectional view of a portion of an integrated circuit during integrated circuit fabrication with a silicon substrate layer of a single silicon wafer with transistors formed on two surfaces.

FIG. 6 is a generalized diagram of a cross-sectional view of a portion of an integrated circuit during integrated circuit fabrication with a silicon substrate layer of a single silicon wafer with transistors formed on two surfaces.

FIG. 8 is a generalized diagram of a cross-sectional view of a portion of an integrated circuit during integrated circuit fabrication with a silicon substrate layer of a single silicon wafer with transistors formed on two surfaces.

FIG. 9 is a generalized block diagram of a method for increasing semiconductor chip functionality in a particular area.

Figure 4:
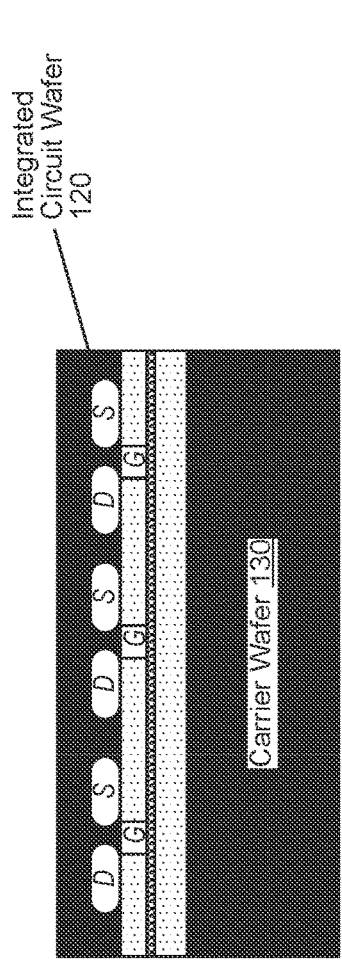
FIG. 4 is a generalized diagram of a cross-sectional view of a portion of an integrated circuit during integrated circuit fabrication with a silicon substrate layer of a single silicon wafer with transistors formed on two surfaces.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Apparatuses and methods efficiently increasing semiconductor chip functionality in a particular area are contemplated. A semiconductor fabrication process (or process) grows a silicon substrate layer of an integrated circuit. The process forms multiple p-type and n-type transistors along a front side surface of the silicon substrate layer. The process flips the silicon substrate layer and removes silicon substrate leaving a particular thickness of the silicon substrate layer. The silicon substrate layer includes a first surface and a second surface different from the first surface. For example, the first surface is now at a bottom of the silicon substrate layer, which has been flipped. The first surface is the original front surface of the silicon substrate layer. The second surface is now at a top of the silicon substrate layer. The second surface is the original back surface of the silicon substrate layer.

It is noted that although orientations and directions, such as the terms top, bottom, above, below, horizontal, and vertical, are used in the description, it is understood that a silicon wafer, an integrated circuit, and a semiconductor package using the silicon substrate layer can be rotated and flipped. Therefore, the materials and layers being described would be rotated and flipped, and the orientations and directions would have a different meaning. However, particular orientations and directions are used during particular process stages to describe the relationships between the materials and layers of stacked transistors formed on two sides of a same silicon wafer. For example, regardless of the orientation of the wafer, the front side surface refers to the surface of the wafer that includes the active device silicon layer used for forming transistors (devices), and the back side surface of the wafer refers to the surface of the wafer that includes the bulk substrate silicon.

The thickness of the silicon substrate layer is measured between the first surface and the second surface along a direction of growth of the silicon substrate layer. In other words, the thickness of the silicon substrate layer is measured in a vertical direction between the first surface (current bottom surface, original front surface) and the second side (current top surface, original back surface) of the silicon substrate layer. The process had removed silicon substrate from the silicon substrate layer until the silicon substrate layer had a thickness that reached a threshold. The threshold has a value that is based on a minimum distance that reduces parasitic latch up effects of transistors formed along the first surface (front surface) of the silicon substrate layer and transistors formed along the second surface (back surface) of the silicon substrate layer. The transistors are one of a variety of types of planar transistors and non-planar transistors. A relatively low impedance path between a power supply terminal providing a power supply reference voltage level and a ground terminal providing a ground reference voltage level activates a parasitic bipolar junction transistors (BJTs) between the transistors.

The process forms multiple p-type and n-type transistors along a second surface (back side surface) of the silicon substrate layer. The multiple p-type and n-type transistors are one of a variety of planar transistor and non-planar transistors. The process also forms one or more metal layers that connect terminals of the transistors formed along the second surface (back side surface) to particular signals. As used herein, a "terminal" of a transistor is also referred to as a "region" of a transistor. For example, source region is also referred to as a source terminal, a drain region is also referred to as a drain terminal, and a gate region is also referred to as a gate terminal. The process forms through silicon vias (TSVs) that traverse through the silicon substrate layer. The process again flips the silicon substrate layer. The process forms metal layers that connect terminals of the transistors formed along the first surface (front side surface) to particular signals. For example, the process connects a first terminal of a first transistor formed on the first surface (front side surface) to a second terminal of a second transistor formed on the second surface (back side surface) by a TSV.

Figure 10:
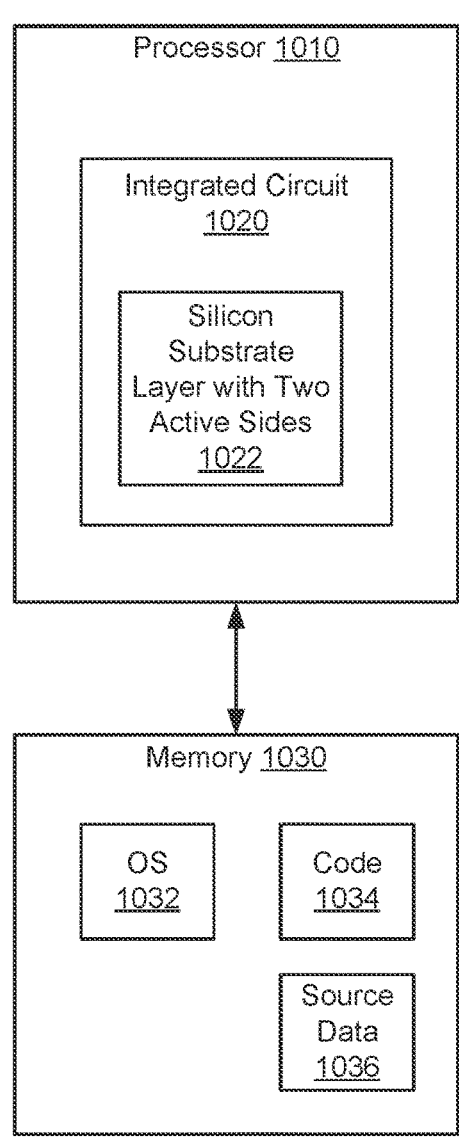
FIG. 10 is a generalized block diagram of a semiconductor chip package with a silicon substrate layer of a single silicon wafer with transistors formed on two surfaces.

In the following description, multiple semiconductor fabrication processing stages are shown in FIGS. 1-8 for increasing semiconductor chip functionality in a particular area. For example, these processing stages form transistors on two surfaces (front side surface and back side surface) of a silicon substrate layer of a single silicon wafer. FIG. 9 provides steps of a method to perform semiconductor fabrication steps to form transistors on two surfaces (front side surface and back side surface) of a silicon substrate layer of a single silicon wafer. These processing steps increase semiconductor chip functionality in a particular area such as an area of a die or an entire die. An example of a fabricated chip package, which includes the silicon substrate layer of a single silicon wafer with transistors formed on two surfaces of the silicon substrate layer, placed in a computing system is shown in FIG. 10.

Turning now to FIG. 1, a generalized block diagram is shown of a cross-sectional view of a portion of an integrated circuit during integrated circuit fabrication 100 with a silicon substrate layer of a single silicon wafer with transistors formed on two surfaces. A semiconductor fabrication process (or process) grows a silicon substrate layer 104 of an integrated circuit wafer 120. A separate carrier wafer 130 also includes a silicon substrate layer 104 at this stage of processing. The process forms multiple p-type and n-type transistors along a front side surface of the silicon substrate layer 104 of an integrated circuit wafer 120. As described earlier, regardless of the orientation of the wafer, the front side surface refers to the surface of the wafer that includes the active device silicon layer used for forming transistors (devices), and the back side surface of the wafer refers to the surface of the wafer that includes the bulk substrate silicon.

Each of the transistors includes a gate terminal 106, a source terminal 108, and a drain terminal 110. The transistors are examples of a variety of planar and non-planar transistors. Non-planar transistors are a recent development in semiconductor processing for reducing short channel effects. Tri-gate transistors, Fin field effect transistors (FETs), and gate all around (GAA) transistors are examples of non-planar transistors. As used herein, the term "transistor" refers to an "active device" or a "device." In various implementations, the transistors include p-type metal oxide semiconductor (MOS) field effect transistors (FETs), which are also referred to as PMOS FETs (pfets), and the transistors also include n-type MOSFETs (nfets).

In an implementation, the n-type source regions 108 and drain regions 110 are epitaxially grown silicon doped with Phosphorous, whereas, the p-type source regions 108 and drain regions 110 are epitaxially grown silicon doped with Boron. In some implementations, the source regions 108 and drain regions 110 included trench silicide contacts. In various implementations, the gate terminal 106 is a metal gate that includes titanium nitride (TiN). However, in other implementations, another type of metal gate is used. An interlayer dielectric (ILD) oxide layer 102 is deposited around the gate region 106. The devices are fabricated by one of a variety of semiconductor fabrication techniques. Examples of these techniques are immersion lithography techniques, the double patterning technique, the extreme ultraviolet lithography (EUV) technique, and the directed self-assembly (DSA) lithography technique.

In other implementations, the integrated circuit wafer 120 is a silicon on insulator (SOI) wafer that includes a layer of insulator, such as a silicon dioxide layer, between the active device silicon layer used for forming transistors (devices) and the bulk silicon substrate layer. The SOI wafer reduces junction capacitance that can provide higher transistor speed and lower transistor power consumption. In addition, the SOI wafer can reduce latch up effects of transistors. In such implementations, the process forms the multiple p-type and n-type transistors along a front side surface of the silicon substrate layer 104 of the SOI wafer.

Referring to FIG. 2, a generalized block diagram is shown of a cross-sectional view of a portion of an integrated circuit during integrated circuit fabrication 200 with a silicon substrate layer of a single silicon wafer with transistors formed on two surfaces. For FIGS. 2-8, components and materials described earlier are numbered identically. The integrated circuit wafer 120 (or wafer 120) has a barrier film 210 deposited on the ILD oxide layer 102. In some implementations, the barrier film 210 is silicon nitride. In other implementations, the barrier film 210 is a low-k chemical vapor deposition (CVD) barrier film, designated BLOk, that is as an alternative to silicon nitride films, and reduces the dielectric constant (k) of copper damascene structures in order to achieve faster transistors. Another ILD oxide layer 102 is deposited on the barrier film 210. In an implementation, the carrier wafer 130 has ILD oxide layer 102 deposited on it to prepare for a bonding process. As described earlier, in some implementations, the integrated circuit wafer 120 is a SOI wafer. Therefore, the multiple p-type and n-type transistors formed along the front side surface of the silicon substrate layer 104 of the SOI wafer is separated from the bulk silicon substrate by a layer of insulator such as a silicon dioxide layer.

Turning now to FIG. 3, a generalized block diagram is shown of a cross-sectional view of a portion of an integrated circuit during integrated circuit fabrication 300 with a silicon substrate layer of a single silicon wafer with transistors formed on two surfaces. The process flips the wafer 120 and bonds the wafer 120 to the carrier wafer 130. In an implementation, the bonding is performed by oxide-oxide bonding, which is also known as molecular, fusion or direct wafer bonding. Referring to FIG. 4, a generalized block diagram is shown of a cross-sectional view of a portion of an integrated circuit during integrated circuit fabrication 400 with a silicon substrate layer of a single silicon wafer with transistors formed on two surfaces. In some implementations, a chemical mechanical planarization (CMP) step is used to remove unwanted silicon substrate layer 104 and to polish the remaining silicon substrate layer 104 on the integrated circuit wafer 120. Following this, the silicon substrate layer 104, which is also referred to as silicon substrate 104, is etched to the desired thickness.

The thickness is measured from the newly polished back side surface to the source and drain regions of the formed transistors. In various implementations, the thickness is greater than a distance that reduces latch up effects of transistors formed on either side of the silicon substrate 104 on the integrated circuit wafer 120. For example, the thickness is greater than a distance that reduces latch up effects of the already-formed transistors (shown in FIG. 4) and transistors that will be formed on the back side surface of the silicon substrate 104 layer (shown in upcoming FIG. 5). In other implementations, the integrated circuit wafer 120 is a SOI wafer, and the CMP step or other step used to remove unwanted silicon substrate 104 does so until a desired thickness of the remaining silicon substrate 104 is reached. In such implementations, the thickness is measured from the newly polished back side surface to the insulator layer of the SOI wafer.

Figure 5:
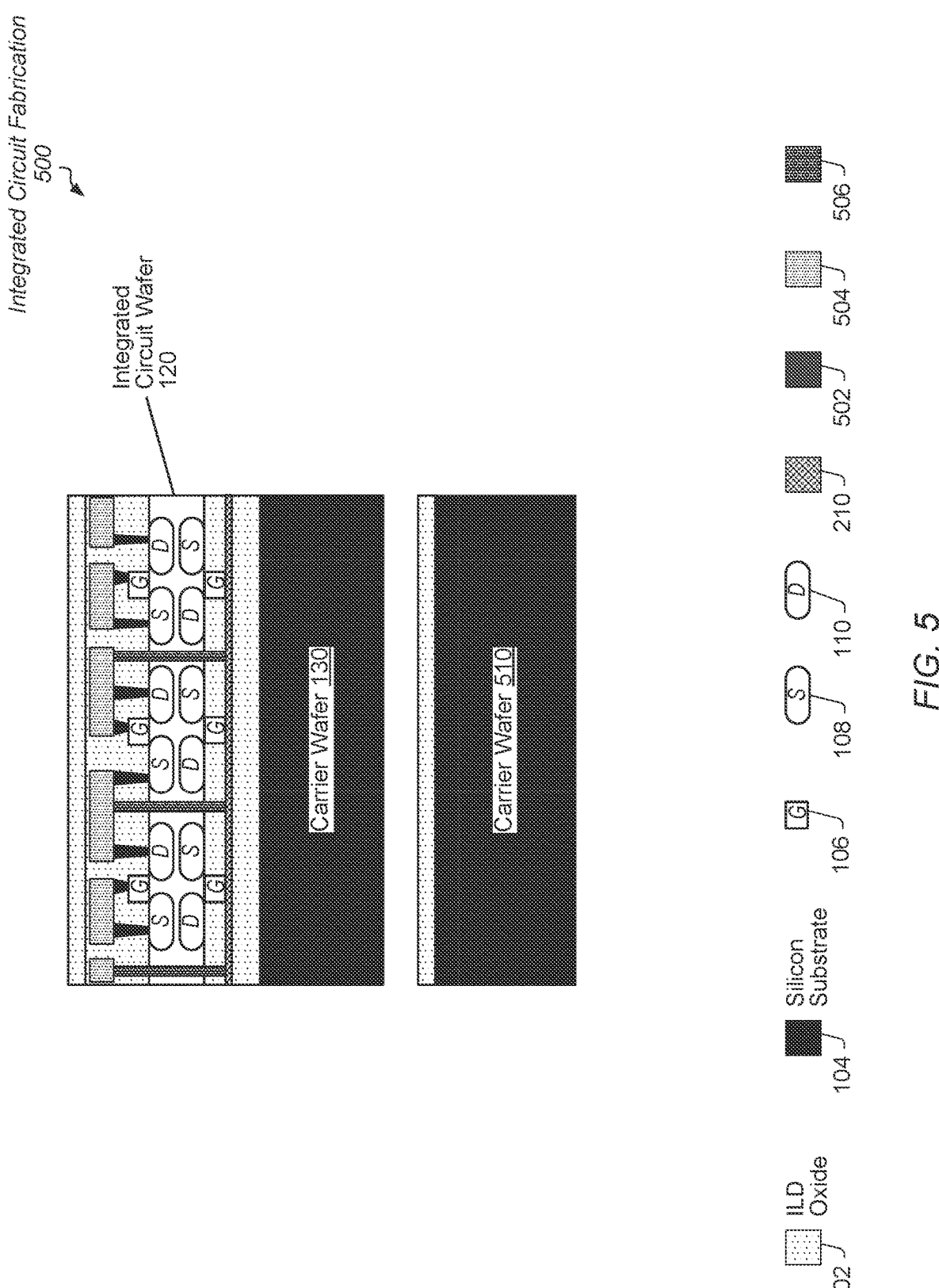
FIG. 5 is a generalized diagram of a cross-sectional view of a portion of an integrated circuit during integrated circuit fabrication with a silicon substrate layer of a single silicon wafer with transistors formed on two surfaces.

Turning now to FIG. 5, a generalized block diagram is shown of a cross-sectional view of a portion of an integrated circuit during integrated circuit fabrication 500 with a silicon substrate layer of a single silicon wafer with transistors formed on two surfaces. The process forms multiple p-type and n-type transistors along a second surface (back side surface) of the silicon substrate layer 104 of the wafer 120. As described earlier, the multiple p-type and n-type transistors are one of a variety of planar transistor and non-planar transistors. The process also forms one or more contacts 502, one or more metal layers 504 that connect terminals of the transistors formed along the second surface (back side surface) to particular signals. The process also forms through silicon vias (TSVs) 506 that traverse through the silicon substrate layer 104 of the wafer 120. The ILD oxide layer 102 is deposited around the transistors. In an implementation, another carrier wafer 510 has ILD oxide layer 102 deposited on it to prepare for a bonding process.

In other implementations, the integrated circuit wafer 120 is a SOI wafer, and the insulator layer of the SOI wafer is located between the transistors formed on the first surface (front side surface) of the silicon substrate layer 104 of the wafer 120 and the transistors formed on the second surface (back side surface) of the silicon substrate layer 104 of the wafer 120. Therefore, the transistors formed on the first surface (front side surface) and the transistors formed on the second surface (back side surface) are electrically isolated from one another by the insulator layer of the SOI wafer. In the following description for FIGS. 6-10, it is noted that in some implementations, the integrated circuit wafer 120 is a SOI wafer, and the transistors being shown on the first surface (front side surface) and the transistors being shown on the second surface (back side surface) are electrically isolated from one another by the insulator layer of the SOI wafer. In some implementations, the signal routes that connect terminals of transistors formed on the first surface (front side surface) to terminals of transistors formed on the second surface (back side surface) have pathways etched in the insulator layer of the SOI wafer to allow for metal routes to be formed between transistors on the first surface (front side surface) and the second surface (back side surface). In other implementations, no signal routes are used to connect terminals of transistors on the first surface (front side surface) and the second surface (back side surface). In such implementations, the insulator layer of the SOI wafer is not etched.

Referring to FIG. 6, a generalized block diagram is shown of a cross-sectional view of a portion of an integrated circuit during integrated circuit fabrication 600 with a silicon substrate layer of a single silicon wafer with transistors formed on two surfaces. The process flips the wafer 120 and bonds the wafer 120 to the carrier wafer 510. In an implementation, the bonding is performed by oxide-oxide bonding, which is also known as molecular, fusion or direct wafer bonding.

Figure 7:
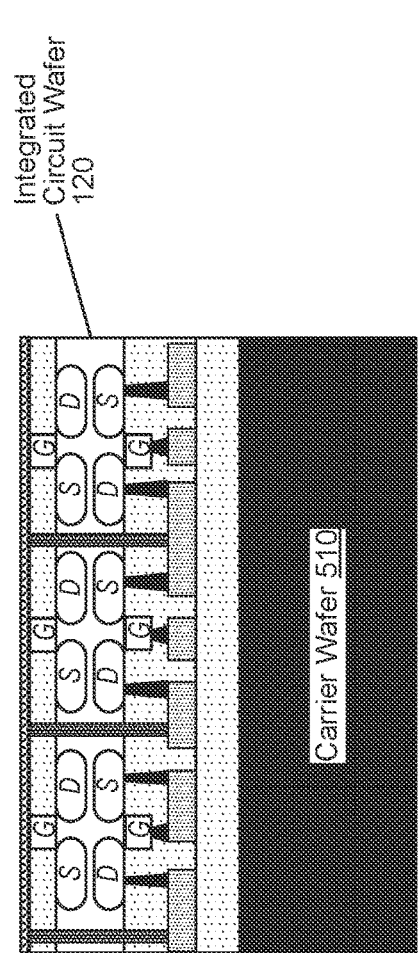
FIG. 7 is a generalized diagram of a cross-sectional view of a portion of an integrated circuit during integrated circuit fabrication with a silicon substrate layer of a single silicon wafer with transistors formed on two surfaces.

Turning now to FIG. 7, a generalized block diagram is shown of a cross-sectional view of a portion of an integrated circuit during integrated circuit fabrication 700 with a silicon substrate layer of a single silicon wafer with transistors formed on two surfaces. In some implementations, a chemical mechanical planarization (CMP) step is used to remove both unwanted silicon substrate 104 of the carrier wafer 130 and the ILD layer 102 down to the barrier film 210. Referring to FIG. 8, a generalized block diagram is shown of a cross-sectional view of a portion of an integrated circuit during integrated circuit fabrication 800 with a silicon substrate layer of a single silicon wafer with transistors formed on two surfaces. In some implementations, a CMP step or an etch step is used to remove the barrier film 210, and additional metal layers are added to the transistors on the front side surface of the wafer 120.

In an implementation, the carrier wafer 510 is removed, and the wafer 120 is bonded to a glass carrier when thin dies are needed in a design. Probing can be done on either the front side surface or the back side surface of the wafer 120. Additionally, both the front side surface and the back side surface of the wafer 120 is ready for copper (Cu) hybrid bonding, if needed. In some implementations, the carrier wafer 510 is replaced with a second die such as a three-dimensional (3D) memory, another integrated circuit, or other. Therefore, the functionality of the fabricated chip has higher transistor density and increases semiconductor chip functionality in at least a particular area of the die.

Referring to FIG. 9, a generalized block diagram is shown of a method 900 for increasing semiconductor chip functionality in a particular area. For purposes of discussion, the steps in this implementation are shown in sequential order. However, in other implementations some steps occur in a different order than shown, some steps are performed concurrently, some steps are combined with other steps, and some steps are absent.

A semiconductor fabrication process (or process) grows a silicon substrate layer of an integrated circuit (block 902). The process forms multiple p-type and n-type transistors along a front side surface of the silicon substrate layer (block 904). The multiple p-type and n-type transistors are one of a variety of planar transistor and non-planar transistors. The process flips the silicon substrate layer and removes silicon substrate leaving a particular thickness of the silicon substrate layer (block 906). The silicon substrate layer includes a first surface and a second surface different from the first surface. For example, the first surface is now at a bottom of the silicon substrate layer. The first surface is the original front surface of the silicon substrate layer. The second surface is now at a top of the silicon substrate layer. The second surface is the original back surface of the silicon substrate layer.

The thickness of the silicon substrate layer is measured between the first surface and the second surface along a direction of growth of the silicon substrate layer. In other words, the thickness of the silicon substrate layer is measured in a vertical direction between the first surface (current bottom surface, original front surface) and the second side (current top surface, original back surface) of the silicon substrate layer. The process had removed silicon substrate from the silicon substrate layer until the silicon substrate layer had a thickness that reached a threshold. The threshold has a value that is based on a minimum distance that reduces parasitic latch up effects of transistors formed along the first surface (front side surface) of the silicon substrate layer and transistors formed along the second surface (back side surface) of the silicon substrate layer. A relatively low impedance path between a power supply terminal providing a power supply reference voltage level and a ground terminal providing a ground reference voltage level activates a parasitic bipolar junction transistors (BJTs) between MOS-FETs.

It is noted that although orientations and directions, such as the terms top, bottom, above, below, horizontal, and vertical, are used in the description, it is understood that a silicon wafer, an integrated circuit, and a semiconductor package using the silicon substrate layer can be rotated and flipped. Therefore, the materials and layers being described would be rotated and flipped, and the orientations and directions would have a different meaning. However, particular orientations and directions are used during particular process stages to describe the relationships between the materials and layers of stacked transistors formed on two sides (front side surface and back side surface) of a same silicon wafer.

The process forms multiple p-type and n-type transistors along a second surface of the silicon substrate layer (block 908). The process also forms one or more metal layers (block 910). In an implementation, the second surface is the back side surface of the silicon wafer, and the metal layers connect terminals of the transistors formed along the second surface (back side surface) to particular signals. The process forms through silicon vias (TSVs) that traverse through the silicon substrate layer, and the process flips the silicon substrate layer (block 912). The process forms metal layers. For example, the process forms one or more metal layers that connect terminals of the transistors formed along the first surface (front side surface) to particular signals. The process connects a first terminal of a first transistor to a second terminal of a second transistor by a TSV (block 914).

If a potential is not applied to an input node of the standard cell ("no" branch of the conditional block 916), then the standard cell waits for power up (block 918). However, if a potential is applied to the input node of the standard cell ("yes" branch of the conditional block 916), then the circuitry of the standard cell conveys a current from the input node to an output node of the standard cell through one of the first transistor and the second transistor (block 920).

Referring to FIG. 10, a generalized block diagram is shown of a computing system 1000. The computing system 1000 includes the processor 1010 and the memory 1030. Interfaces, such as a memory controller, a bus or a communication fabric, one or more phased locked loops (PLLs) and other clock generation circuitry, a power management unit, and so forth, are not shown for ease of illustration. It is understood that in other implementations, the computing system 1000 includes one or more of other processors of a same type or a different type than processor 1010, one or more peripheral devices, a network interface, one or more other memory devices, and so forth. In some implementations, the functionality of the computing system 1000 is incorporated on a system on chip (SoC). In other implementations, the functionality of the computing system 1000 is incorporated on a peripheral card inserted in a motherboard. The computing system 1000 is used in any of a variety of computing devices such as a desktop computer, a tablet computer, a laptop, a smartphone, a smartwatch, a gaming console, a personal assistant device, and so forth.

The processor 1010 includes hardware such as circuitry. For example, the processor 1010 includes at least one integrated circuit 1020, which utilizes Cross FETs 1022. For example, one or more standard cells are instantiated in the integrated circuit 1020. These standard cells include silicon substrate layer with two active sides 1022 such as the semiconductor fabricated structure shown in FIG. 8. In various implementations, the processor 1010 includes one or more processing units. In some implementations, each of the processing units includes one or more processor cores capable of general-purpose data processing, and an associated cache memory subsystem. In such an implementation, the processor 1010 is a central processing unit (CPU). In another implementation, the processing cores are compute units, each with a highly parallel data microarchitecture with multiple parallel execution lanes and an associated data storage buffer. In such an implementation, the processor 1010 is a graphics processing unit (GPU), a digital signal processor (DSP), or other.

In some implementations, the memory 1030 includes one or more of a hard disk drive, a solid-state disk, other types of flash memory, a portable solid-state drive, a tape drive and so on. The memory 1030 stores an operating system (OS) 1032, one or more applications represented by code 1034, and at least source data 1036. Memory 1030 is also capable of storing intermediate result data and final result data generated by the processor 1010 when executing a particular application of code 1034. Although a single operating system 1032 and a single instance of code 1034 and source data 1036 are shown, in other implementations, another number of these software components are stored in memory 1030. The operating system 1032 includes instructions for initiating the boot up of the processor 1010, assigning tasks to hardware circuitry, managing resources of the computing system 1000 and hosting one or more virtual environments.

Each of the processor 1010 and the memory 1030 includes an interface unit for communicating with one another as well as any other hardware components included in the computing system 1000. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
a first transistor comprising a first source diffusion region;
a silicon substrate layer comprising a first surface stacked adjacent to the first source diffusion region of the first transistor; and
a second transistor comprising a second source diffusion region stacked adjacent to a second surface different from the first surface of the silicon substrate layer; and
wherein responsive to a potential being applied to an input node of a cell of the integrated circuit, a current is conveyed from the input node to an output node of the cell through one of the first transistor and the second transistor.

2. The integrated circuit as recited in claim 1, wherein a thickness of the silicon substrate layer:
is measured between the first surface and the second surface along a direction of growth of the silicon substrate layer; and
is greater than a distance that reduces latch up effects of each of the first transistor and the second transistor.

3. The integrated circuit as recited in claim 1, wherein:
the first surface is a front side surface of a wafer comprising the silicon substrate layer; and
the second surface is a back side surface of the wafer.

4. The integrated circuit as recited in claim 3, wherein a location of a first metal gate of the first transistor is aligned with a location of a second metal gate of the second transistor in a direction of growth of a thickness of the silicon substrate layer.

5. The integrated circuit as recited in claim 3, wherein a first terminal of the first transistor is connected to a second terminal of the second transistor by a through silicon via (TSV) that traverses through the silicon substrate layer.

6. The integrated circuit as recited in claim 3, wherein each of a first plurality of transistors formed along the first surface of the silicon substrate layer and a second plurality of transistors formed along the second surface of the silicon substrate layer comprises one or more p-type transistors and n-type transistors.

7. The integrated circuit as recited in claim 3, wherein the wafer is a silicon on insulator (SOI) wafer with an insulator layer located between the first transistor and the second transistor.

8. A computing system comprising:
a memory configured to store instructions of one or more tasks and source data to be processed by the one or more tasks;
an integrated circuit configured to execute the instructions using the source data, wherein the integrated circuit comprises:
a first transistor comprising a first source diffusion region;
a silicon substrate layer comprising a first surface stacked adjacent to the first source diffusion region of the first transistor; and
a second transistor comprising a second source diffusion region stacked adjacent to a second surface different from the first surface of the silicon substrate layer; and
wherein responsive to a potential being applied to an input node of a cell of the integrated circuit, a current is conveyed from the input node to an output node of the cell through one of the first transistor and the second transistor.

9. The computing system as recited in claim 8, wherein a thickness of the silicon substrate layer:

is measured between the first surface and the second surface along a direction of growth of the silicon substrate layer; and is greater than a distance that reduces latch up effects of each of the first transistor and the second transistor.

10. The computing system as recited in claim 8, wherein:

the first surface is a front side surface of a wafer comprising the silicon substrate layer; and the second surface is a back side surface of the wafer.

11. The computing system as recited in claim 10, wherein a location of a first metal gate of the first transistor is aligned with a location of a second metal gate of the second transistor in a direction of growth of a thickness of the silicon substrate layer.

12. The computing system as recited in claim 10, wherein a first terminal of the first transistor is connected to a second terminal of the second transistor by a through silicon via (TSV) that traverses through the silicon substrate layer.

13. The computing system as recited in claim 10, wherein:

a first plurality of transistors formed along the first surface of the silicon substrate layer comprises one or more p-type transistors and n-type transistors; and a second plurality of transistors formed along the second surface of the silicon substrate layer comprises one or more p-type transistors and n-type transistors.

* * * * *